(12) United States Patent
Murphy

(10) Patent No.: US 8,914,085 B2
(45) Date of Patent: Dec. 16, 2014

(54) SUPERCONDUCTING FAULT CURRENT LIMITER MONITORING

(75) Inventor: Paul J. Murphy, Reading, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 157 days.

(21) Appl. No.: 13/492,103

(22) Filed: Jun. 8, 2012

(65) Prior Publication Data

US 2012/0316070 A1 Dec. 13, 2012

Related U.S. Application Data

(60) Provisional application No. 61/495,349, filed on Jun. 9, 2011.

(51) Int. Cl.
*H01L 39/24* (2006.01)
*H01L 39/16* (2006.01)
*H02H 9/04* (2006.01)
*H02H 9/02* (2006.01)

(52) U.S. Cl.
CPC ............... *H02H 9/042* (2013.01); *H01L 39/16* (2013.01); *H02H 9/023* (2013.01)
USPC ....................................................... 505/163

(58) Field of Classification Search
CPC .......... H02H 7/001; H02H 9/023; H01L 39/24
See application file for complete search history.

(56) References Cited

U.S. PATENT DOCUMENTS

| 5,250,508 A * | 10/1993 | Pham ............................. 505/211 |
| 8,169,756 B2 * | 5/2012 | Husband et al. ................. 361/19 |
| 2006/0122067 A1 * | 6/2006 | Holcomb ....................... 505/124 |
| 2010/0177450 A1 * | 7/2010 | Holcomb et al. ................. 361/19 |
| 2012/0044603 A1 * | 2/2012 | Dommerque ...................... 361/19 |
| 2012/0153927 A1 * | 6/2012 | Wolfus et al. ................. 323/310 |
| 2012/0264613 A1 * | 10/2012 | Tekletsadik .................... 505/150 |
| 2012/0327538 A1 * | 12/2012 | Lim et al. ........................ 361/19 |

* cited by examiner

*Primary Examiner* — Colleen Dunn

(57) ABSTRACT

A superconducting fault current limiter (SCFCL) includes a cryogenic tank defining an interior volume, a superconductor disposed in the interior volume, and a voltage detector configured to detect a voltage drop across the superconductor and provide a voltage signal representative of the voltage drop. This voltage detector enables real time monitoring of a condition of the superconductor during steady state operation of the SCFCL. If the voltage drop exceeds an acceptable voltage drop, corrective action such as maintenance, repair, and/or replacement may be taken.

12 Claims, 5 Drawing Sheets

SUPERCONDUCTING FAULT CURRENT LIMITER MONITORING

CROSS REFERENCE TO RELATED APPLICATIONS

This application claims the benefit of provisional patent application No. 61/495,349, filed Jun. 9, 2011, which is incorporated herein by reference.

FIELD

This disclosure relates to superconducting fault current limiters, and more particularly to superconducting fault current limiter monitoring.

BACKGROUND

A superconducting fault current limiter (SCFCL) is a device that limits fault currents in a power system. The power system may include transmission and distribution networks to deliver power to differing industrial, commercial, and residential loads. A fault current is an abnormal current in an electrical circuit due to a fault such as a short circuit resulting in a short circuit or fault current. A fault current may occur due to any number of events or failures such as severe weather damaging power lines and components, e.g., lighting striking the power system. When faults occur, a large load appears instantaneously. The network, in response, delivers a large amount of current (i.e. fault current) to this load or, in this case, the faults. This surge or fault current condition is undesirable since it may damage the network or equipment connected to the network.

A SCFCL includes a superconductor positioned in a cryogenic tank. The superconductor is in a superconducting state having zero resistance during a steady state condition. To maintain the superconductor in the superconducting state, the superconductor is operated below its critical temperature, critical current density, and critical magnetic field. If any one of these three is exceeded, the superconductor quenches from its superconducting state to a normal state and exhibits a resistance. To maintain the superconductor at a temperature below its critical temperature, a refrigeration system provides a cryogenic cooling fluid to the cryogenic tank housing the superconductor.

FIG. 1 is a circuit diagram of one power system 100 having a SCFCL 106 consistent with the prior art. The power system 100 also includes an AC power generator 102, a shunt 114 in parallel with the SCFCL 106, a circuit breaker 108 which is normally closed, and differing loads 110. Under steady state conditions, the AC power generator 102 provides power to the loads 110. The circuit breaker 108 is closed and load current flows through conductor 103, the SCFCL 106, and conductor 105 to the loads 110. The superconductor of the SCFCL 106 is in a superconducting state exhibiting zero resistance during the steady state condition. A fault condition may occur as illustrated by the inadvertent path to ground at location 112. In response, the AC power generator 102 attempts to deliver a large amount of fault current. The superconductor quenches and exhibits a resistance much larger than the resistance of the shunt 114. Hence, the fault current is commutated into the shunt 114 which limits the fault current to an acceptable level by reducing the peak to peak value of the fault current before the circuit breaker 108 can open (a conventional circuit breaker 108 typically takes 2 to 3 cycles before opening when operating at a conventional 60 Hz).

A drawback of the conventional SCFCL 106 is that the superconductor portion of the SCFCL 106 may degrade over time. Degradation of the superconductor may be due to mechanically induced stress and/or thermally induced stress. Mechanically induced stress may include fatigue or fault stress from an excessive amount of fault conditions. Thermally induced stress may occur due to the SCFCL 106 handling an excessive amount of fault conditions and/or excessive fault current amplitudes. In addition, aging of the SCFCL may contribute to degradation of the superconductor performance. As one or more portions of the superconductor degrade over time, the critical current density that is necessary to quench the superconductor may be lowered. This may lead to inadvertent quenching and/or unreliability of the SCFCL 106.

Accordingly, there is a need in the art for a SCFCL and method of operating a SCFCL that overcomes the above-described inadequacies and shortcomings.

SUMMARY

According to a one aspect of the disclosure, a SCFCL is provided. The SCFCL includes a cryogenic tank defining an interior volume, a superconductor disposed in the interior volume, and a voltage detector configured to detect a voltage drop across the superconductor and provide a voltage signal representative of the voltage drop.

According to another aspect of the disclosure, a method of operating a SCFCL includes cooling a superconductor disposed within an interior volume of a cryogenic tank to a temperature less than a critical temperature of the superconductor, providing a load current through the superconductor, monitoring a voltage drop across the superconductor, and providing a voltage signal representative of the voltage drop.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
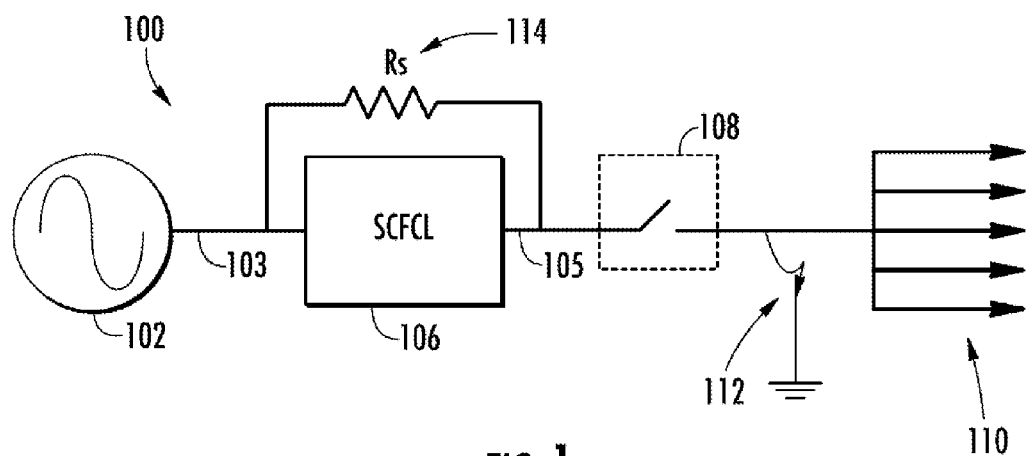
FIG. 1 is diagram of a SCFCL in a power system of the prior art.

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
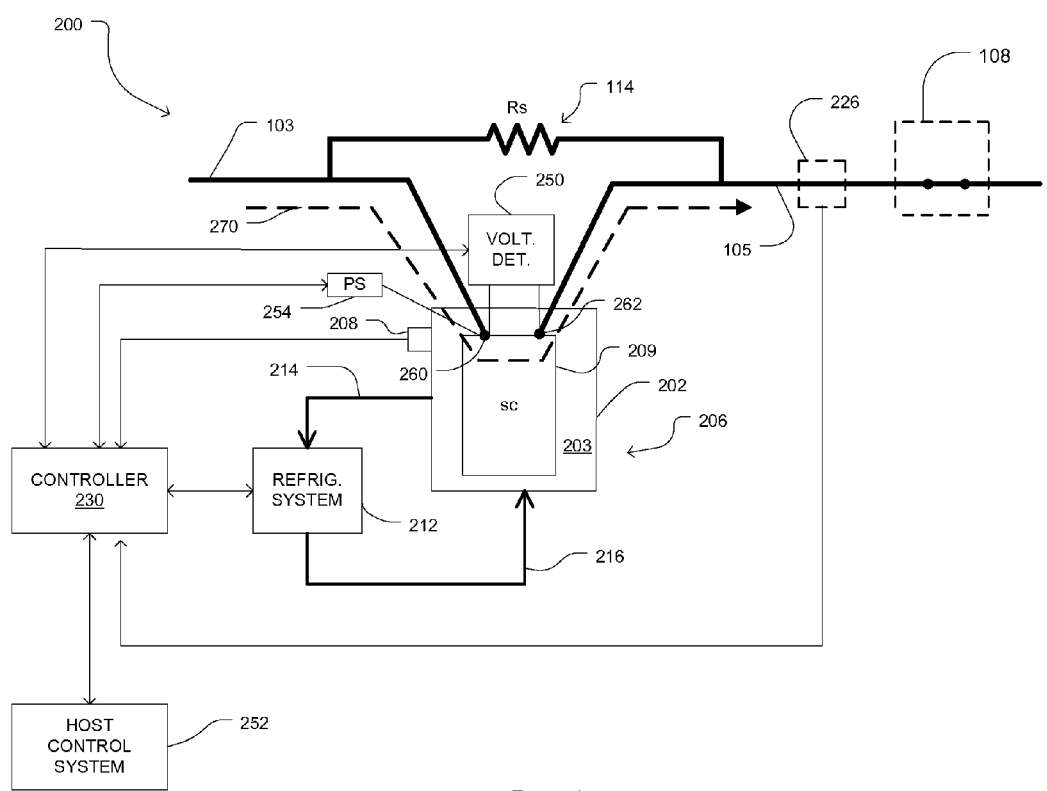
FIG. 2 is a diagram of a SCFCL consistent with an embodiment of the disclosure operating in a steady state condition.

Turning to FIG. 2, a block diagram of a power system 200 having a SCFCL 206 consistent with an embodiment of the disclosure is illustrated. The SCFCL 206 may include a cryogenic tank 202 defining an interior volume 203, a superconductor 209 positioned in the interior volume 203, a refrigeration system 212, a voltage detector 250, and a power supply 254. For clarity of illustration, only one SCFCL 206 for one phase is illustrated. Those skilled in the art will recognize that there may be three SCFCLs (one for each phase) of a three phase AC power system.

The cryogenic tank 202 may be fabricated of differing materials such as dielectric materials and/or thermally insulating materials. The superconductor 209 may be any type of superconducting material such as yttrium barium copper oxide (YBCO) that exhibits superconducting properties when held below its critical temperature, critical current density, and critical magnetic field. The superconductor 209 may have different superconducting modules depending on the amount of superconducting material required and the selected configuration. The refrigeration system 212 is configured to provide a cryogenic liquid to the cryogenic tank 202 via a supply conduit 216 and to receive the same via a return conduit 214. The refrigeration system 212 may include a cryogenic cooling unit to cool the input cryogenic fluid received from the return conduit 214 before providing cooled cryogenic fluid back via the supply conduit 216. The refrigeration system 212 may include valves, pumps, and sensors. The refrigeration system 212 may also include a storage tank to store additional cryogenic cooling fluid. The cryogenic cooling fluid may be liquid nitrogen, liquid helium, liquid argon, liquid neon, etc. and/or mixtures of the same. The voltage detector 250 may have two leads coupled to an entrance point 260 and an exit point 262 of the superconductor 209 to detect a voltage drop across the superconductor 209. The voltage detector 250 is also configured to provide a voltage signal representative of the voltage drop to the controller 230. The power supply 254 is configured to inject a test current into the superconductor 209. The power supply 254 may provide a DC test current or AC test current and may be electrically coupled to the entrance point 260 of the superconductor 209.

In addition, the SCFCL 206 may include sensors such as a temperature sensor 208 and a current sensor 226. The temperature sensor 208 is illustrated as being on the outside of the cryogenic tank 202 but may be positioned in other locations as well to monitor the temperature of the superconductor 209 and/or the cryogenic cooling fluid inside the interior volume 203. The current sensor 226 may be positioned to monitor in real time the current draw on conductor 105. Any type of current sensor may be utilized such as a current transformer positioned about the conductor 105.

The controller 230 can be or include a general-purpose computer or network of general-purpose computers that may be programmed to perform desired input/output functions. The controller 230 can also include other electronic circuitry or components, such as application specific integrated circuits, other hardwired or programmable electronic devices, discrete element circuits, etc. The controller 230 may also include communication devices, data storage devices, and software. The controller 230 may receive input signals from a variety of systems and components such as the voltage detector 250, the power supply 254, the temperature sensor 208, the current sensor 226, the refrigeration system 212, etc. to determine a condition of one or more components and also to control the same. The controller 230 may also communicate with a host control system 252 that monitors and controls many components over a wide area of the power system 200 such as a supervisory control and data acquisition (SCADA) system.

In operation, during a steady state condition the superconductor 209 is in a superconducting state. The refrigeration system 212 provides a cryogenic liquid to the cryogenic tank 202 via the supply conduit 216 and receives return cryogenic liquid to be re-cooled via the return conduit 214. The temperature of the superconductor 209 remains below its critical temperature. The critical temperature may be between about 77° K and 93° K for high temperature superconductors. Load current flows through the SCFCL 206 and the superconductor 209 along path 270 to the loads of the power system 200 during the steady state condition.

The voltage detector 250 detects a voltage drop across the superconductor 209 during the steady state condition. The voltage drop across the superconductor 209 may have an expected value based on the anticipated load current and impedance of the superconductor 209 during steady state operation. For instance, the expected voltage drop may be zero to a nominal value. In some instances, the superconductor 209 may have a plurality of superconductor modules connected via copper conductors. The type and amount of copper conductors introduce impedance which would increase the expected voltage drop.

The voltage detector 250 is further configured to provide a voltage signal representative of the voltage drop across the superconductor 209 to the controller 230. The controller 230 may be configured to compare the voltage drop to a threshold level. If the voltage drop is less than the threshold, this may be representative of normal superconducting operation of the superconductor 209 during steady state conditions. If the voltage drop is greater than the threshold level, this may be representative of excessive impedance in the superconductor 209. The threshold level may be as high as several volts or as low as several microvolts. The controller 230 may provide an error signal to the host control system 252 if the voltage drop is greater than the threshold voltage level. In this way, personnel may be dispatched to repair the superconductor 209. In addition, the controller 230 may store a plurality of voltage drops over a time period to build a history of voltage drops during this time period under differing load current conditions. The controller 230 may also compare the current voltage drop to the stored history of voltage drops to determine a current condition of the superconductor 209.

Figure 3:
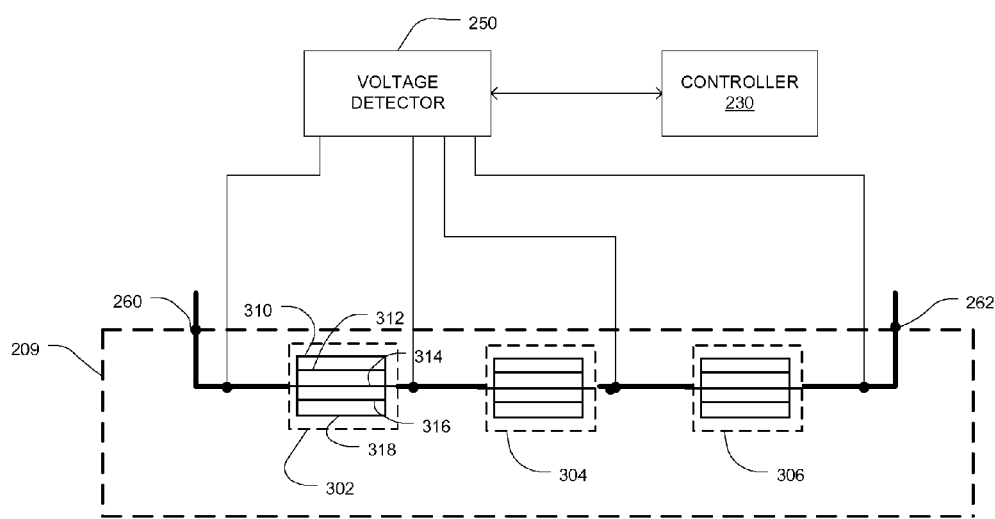
FIG. 3 is a block diagram of one embodiment of the superconductor of FIG. 2 having a plurality of superconductor modules.

Turning to FIG. 3, more details of one embodiment of the superconductor 209 of FIG. 2 are illustrated. The superconductor 209 may include three superconductor modules 302, 304, 306 electrically coupled in series. Nonsuperconducting electrical connectors such as copper may couple each superconductor module 302, 304, 306, to each other. Each superconductor module 302, 304, 306 may include a plurality of superconducting elements electrically coupled in parallel. For instance, the superconductor module 302 includes five superconducting elements 310, 312, 314, 316, 318 electrically coupled in parallel. Although five superconducting elements 310, 312, 314, 316, 318 are illustrated in each superconductor module 302, 304, 306, those skilled in the art will recognize that any quantity of superconducting elements such as superconducting tape may be utilized depending on factors such as the expected load currents and voltage levels.

Advantageously, different leads may be coupled from the voltage detector 250 to differing portions of the superconductor 209 to measure the voltage drop across the entirety of the superconductor 209 and across different portions such as across the first superconductor module 302, the second superconductor module 304, and/or the third superconductor module 306. The voltage detector 250 may provide a first signal to the controller 230 representative of the first voltage drop across the first superconductor module 302, and similarly for other superconductor modules 304, 306. In this way, the controller 230 is able to not only determine if there is an excessive voltage drop across the entirety of the superconductor 209, but also across one or more portions such as the superconductor modules 302, 304, 306. If there is an excess voltage drop detected, support personnel have access to more particular information about which portion of the superconductor 209 may need maintenance, repair, and/or replacement. For example, the first signal may indicate a degrading condition of the first superconductor module 302 while the other superconductor modules 304, 306 are in satisfactory working condition.

Figure 4:
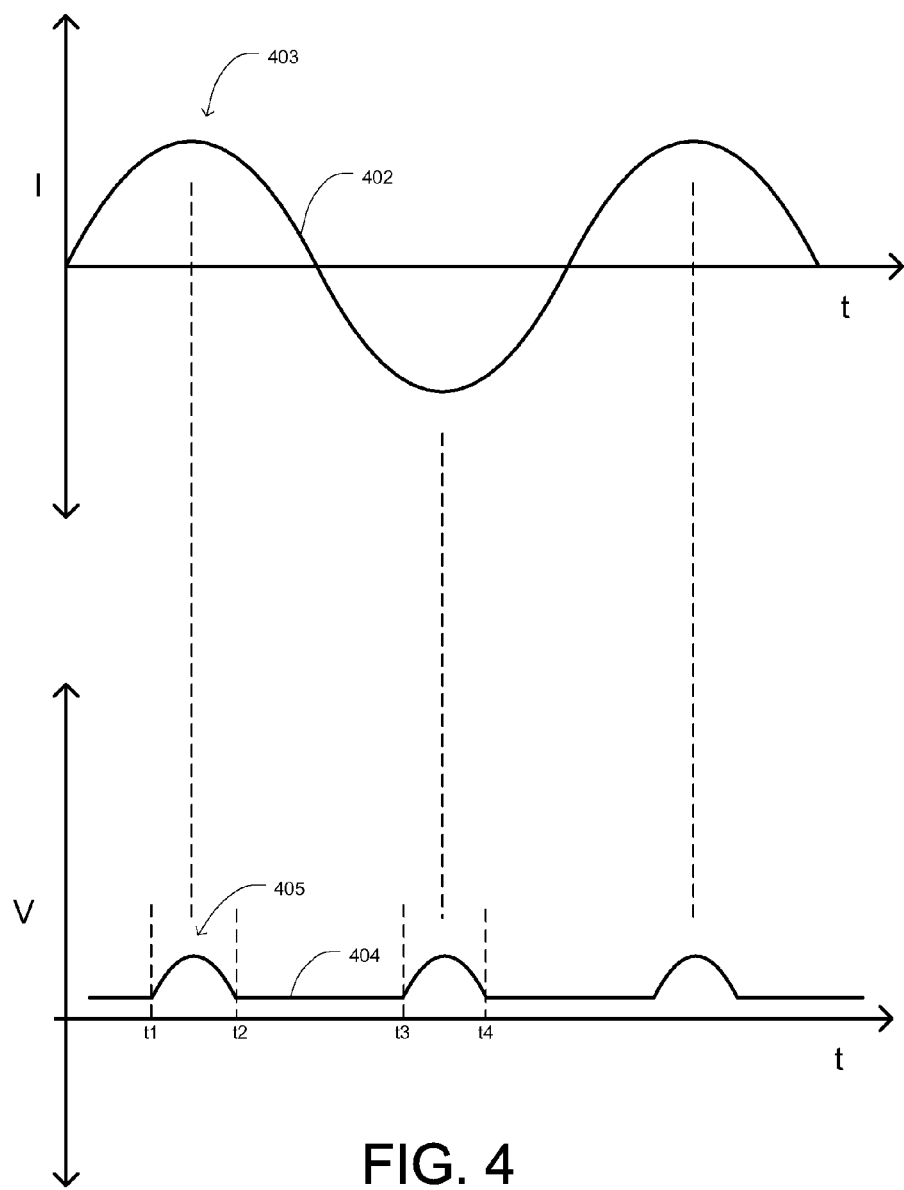
FIG. 4 is a plot of load current and an associated voltage signal over the same time scale.

Turning to FIG. 4, a plot 402 of AC load current (I) is illustrated over time. This AC load current flows along path 270 and through the superconductor 209 during the steady state condition. As shown, the AC load current has a current peak at position 403 of the plot 402. A plot 404 of a voltage signal that may be provided by the voltage detector 250 over the same time period is also illustrated. The plot 404 illustrates the absolute value of the voltage drops at different times coincident with the peaks of the AC load current.

If the superconductor 209 is operating properly, the voltage signal should remain relatively constant with a relatively small voltage drop. However, if defective, the superconductor 209 may exhibit an increased resistance if the load current is high enough. Accordingly, the voltage drop increases during certain times. As shown, plot 404 has a relatively constant voltage drop expect for times coincident with the associated peaks of the AC load current. For instance, the voltage drop of plot 404 increases at position 405 coincident with the peak of the AC load current (I). This voltage drop between times (t1) and (t2) may be due to a temporary transition from a superconducting to a nonsuperconducting state of the superconductor representative of a degradation in the superconductor. In one example, this could be due to a "hot spot" in the superconductor. Similarly, the absolute value of another voltage drop between times (t3) and (t4) is illustrated. Differing analytical techniques such as Fourier transform analysis and lock in techniques may be utilized to analyze the non-ideal and reoccurring nature of the voltage signal represented by plot 404 to determine a condition of the superconductor being monitored in situ during the steady state condition. Another way to purposefully generate the non-ideal waveform of FIG. 4 is to control the refrigeration system 212 to permit the operating temperature of the superconductor 209 to rise. As the temperature rises, the critical current density J necessary to quench the superconductor is lowered. In this way, at some point in time a non-ideal waveform similar to plot 404 will be generated.

Figure 5:
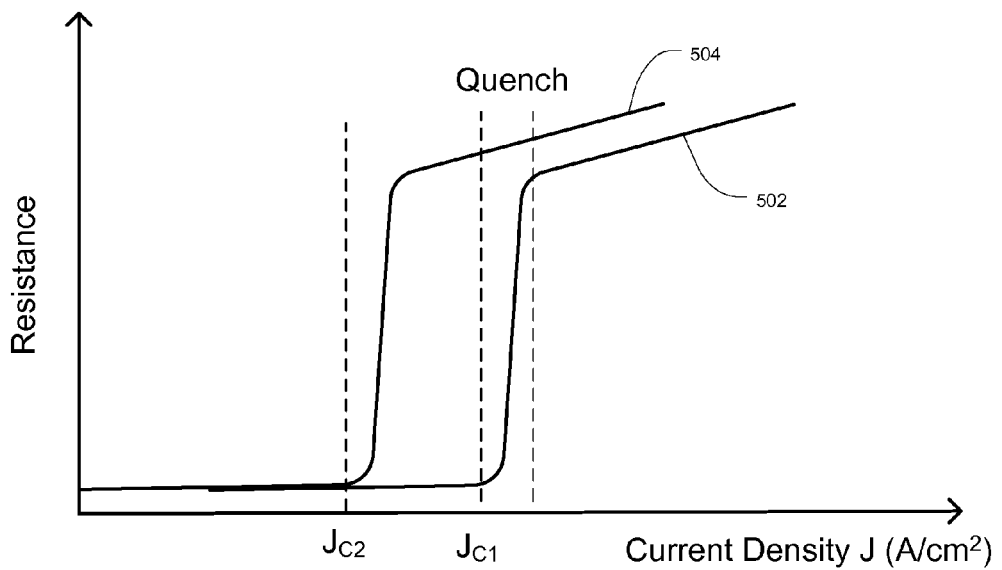
FIG. 5 are plots of resistance versus current density for a superconductor.

Turning to FIG. 5, two plots 502, 504 of resistance versus current density (J) for the superconductor 209 are illustrated. Current density may be expressed in $A/cm^2$. As illustrated, plot 502 has a critical current density of $J_{C1}$. That is, once $J_{C1}$ is exceeded because excessive load current and/or a fault current flowing through the superconductor 209, the superconductor 209 begins to quench and starts to exhibit a much higher resistance. Occasionally, a degradation of the superconductor 209 may effectively lower the critical current density with all other parameters (e.g., temperature and magnetic field) being equal. For example, plot 504 has a critical current density $J_{C2}$ which is less than $J_{C1}$. In other words, the same superconductor may quench at a lower current density due to degradation of the superconductor over time with all other parameters being equal.

In another embodiment consistent with the disclosure, during a steady state condition with current flowing along path 270, the power supply 254 may provide a test current to the superconductor 209. The test current is in addition to the load current. In one instance, the test current may be a DC test current provided by a DC power supply. In other instances, the test current may be an AC test current. The amplitude of the injected test current may be increased over time from 0 volts as the voltage drop across the superconductor 209 is detected.

Figure 6:
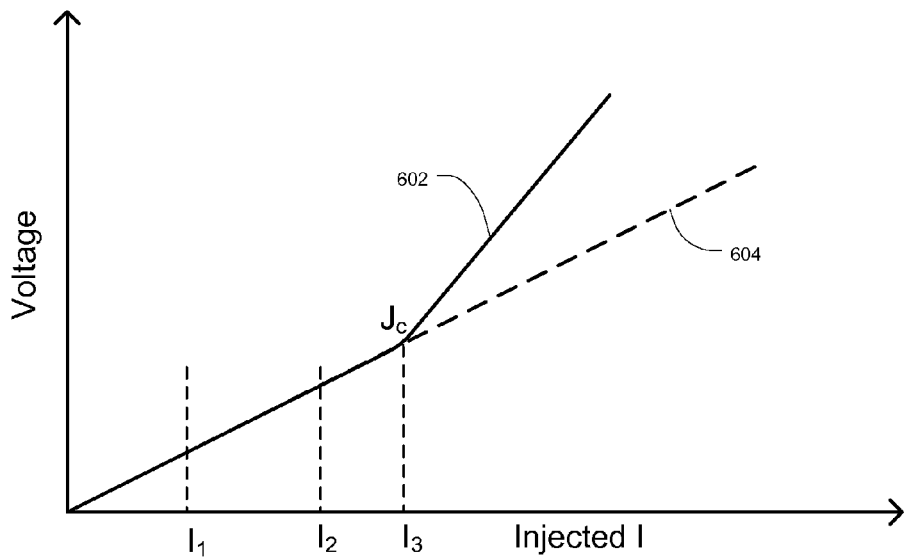
FIG. 6 is a plot of voltage versus injected test current.

FIG. 6 illustrates a plot 602 of voltage versus injected test DC current where $I_1<I_2<I_3$ and where the amplitude of the DC test current is increased over time from 0 volts. The associated voltage drop increases at a rate that is coincident with a linear plot 604 having a first slope. However, once the amplitude of the injected test current exceeds $I_3$, the linear plot transitions to a second slope greater than the first slope. This transition point occurring when the amplitude of the test: current is $I_3$ can be used to determine the critical current density $J_C$ of the superconductor. The test current I3 plus the load current at that time is representative of the critical current density $J_C$. Therefore, periodic tests injecting test current into the superconductor facilitate a monitoring of the critical current density $J_C$. If the monitoring reveals a substantial lessening of the critical current density below an acceptable level, the controller 230 can alert the host control system 252 so corrective actions can be taken. Similarly to voltage drop data, the controller 230 may store critical current density data over time to facilitate comparison of the present current density $J_C$ to historical data for the same superconductor.

Accordingly, there has been provided a SCFCL having a voltage detector configured to detect a voltage drop across the superconductor and provide a voltage signal representative of the voltage drop. This enables real time monitoring of the condition of the superconductor during steady state operation of the SCFCL. If the voltage drop exceeds an acceptable voltage drop, corrective action such as maintenance, repair, and/or replacement may be taken. In addition, the voltage drop may be measured over selective portions of the superconductor to determine if there is an excessive voltage drop across any of those monitored portions. Accordingly, support personnel would have access to information about which particular portion of the superconductor may need maintenance, repair, and/or replacement.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. A superconducting fault current limiter (SCFCL) comprising:
   a cryogenic tank defining an interior volume;
   a superconductor disposed in the interior volume; and
   a voltage detector configured to detect a voltage drop across the superconductor and provide a voltage signal representative of the voltage drop,
   wherein the superconductor comprises a first superconductor module having a first plurality of superconducting elements electrically coupled in parallel, and a second superconductor module having a second plurality of superconducting elements coupled in parallel, and wherein the first superconductor module and second superconductor module are electrically coupled in series, and wherein the voltage detector is configured to detect a first voltage drop across the first superconductor module and provide a first voltage signal representative of the first voltage drop, and wherein the voltage detector is further configured to detect a second voltage drop across the second superconductor module and provide a second voltage signal representative of the second voltage drop.

2. The SCFCL of claim 1, further comprising a controller configured to receive the voltage signal and compare the voltage drop to a threshold voltage level.

3. The SCFCL of claim 2, wherein the controller is further configured to provide an error signal to a host control system if the voltage drop is greater than the threshold voltage level.

4. The SCFCL of claim 1, wherein the voltage detector is further configured to detect a first voltage drop across a first portion of the superconductor and provide a first voltage signal representative of the first voltage drop, and to detect a second voltage drop across a second portion of the superconductor and provide a second voltage signal representative of the second voltage drop.

5. The SCFCL of claim 1, further comprising:
a power supply configured to inject a test current into the superconductor; and
a controller configured to receive and analyze the voltage signal to determine a critical current density of the superconductor in response to an amplitude of the test current.

6. The SCFCL of claim 5, wherein the test current comprises a DC test current.

7. A superconducting fault current limiter (SCFCL) comprising:
a cryogenic tank defining an interior volume;
a superconductor disposed in the interior volume;
a voltage detector configured to detect a voltage drop across the superconductor and provide a voltage signal representative of the voltage drop;
a power supply configured to inject a test current into the superconductor, the test current being in addition to a load current; and
a controller configured to receive and analyze the voltage signal to determine a critical current density of the superconductor in response to an amplitude of the test current.

8. The SCFCL of claim 7, wherein the test current comprises a DC test current.

9. The SCFCL of claim 7, where the power supply is configured to increase the amplitude of the test current over time, and the controller determines the critical current density of the superconductor based on the change in a ratio of the amplitude of the test current to the voltage drop across the superconductor.

10. A superconducting fault current limiter (SCFCL) comprising:
a cryogenic tank defining an interior volume;
a superconductor disposed in the interior volume;
a voltage detector configured to detect a voltage drop across the superconductor and provide a voltage signal representative of the voltage drop;
a current sensor to monitor a current through the superconductor and provide a current signal representative of the current; and
a controller configured to receive the voltage signal and the current signal, compute an impedance of the superconductor and determine degradation of the superconductor based on the computed impedance.

11. The SCFCL of claim 10, wherein the controller is further configured to provide an error signal to a host control system if the impedance is greater than a threshold level.

12. The SCFCL of claim 10, wherein the voltage detector is further configured to detect a first voltage drop across a first portion of the superconductor and provide a first voltage signal representative of the first voltage drop, and to detect a second voltage drop across a second portion of the superconductor and provide a second voltage signal representative of the second voltage drop, and the controller computes an impedance of the first portion and the second portion of the superconductor.

* * * * *